United States Patent [19]

Li et al.

[11] Patent Number: 5,140,390
[45] Date of Patent: Aug. 18, 1992

[54] HIGH SPEED SILICON-ON-INSULATOR DEVICE

[75] Inventors: Mei Li, Mission Viejo; Chen-Chi P. Chang, Newport Beach; Maw-Rong Chin, Huntington Beach, all of Calif.

[73] Assignee: Hughes Aircraft Company, Los Angeles, Calif.

[21] Appl. No.: 646,119

[22] Filed: Jan. 28, 1991

Related U.S. Application Data

[62] Division of Ser. No. 481,032, Feb. 16, 1990, Pat. No. 5,047,356.

[51] Int. Cl.$^5$ ............................................. H01L 27/01
[52] U.S. Cl. ...................................... 357/23.7; 357/4; 357/42; 357/59
[58] Field of Search ................... 357/23.1, 23.7, 71, 357/73, 59 R, 59 A, 42, 2, 4

[56] References Cited

U.S. PATENT DOCUMENTS

| | | | |
|---|---|---|---|
| 4,679,062 | 7/1987 | Okamoto | 357/2 |
| 4,835,597 | 5/1989 | Okuyama et al. | 357/73 |
| 4,907,048 | 3/1990 | Huang | 357/71 |
| 4,948,231 | 8/1990 | Aoki et al. | 357/23.7 |
| 4,992,846 | 2/1991 | Sakakibara et al. | 357/23.7 |
| 4,999,690 | 3/1991 | Rodder | 357/2 |

FOREIGN PATENT DOCUMENTS

| | | | |
|---|---|---|---|
| 58-90783 | 5/1983 | Japan | 357/2 |
| 60-140873 | 7/1985 | Japan | 357/42 |

Primary Examiner—Andrew J. James
Assistant Examiner—Courtney A. Bowers
Attorney, Agent, or Firm—Jeannette M. Walder; Terje Gudmestad; W. K. Denson-Low

[57] ABSTRACT

High speed silicon-on-insulator radiation hardened semiconductor devices and a method of fabricating same. Starting with a SIMOX wafer (10) having a layer of silicon (12) on a layer of buried oxide (11), P-well and N-well masks are aligned to an oversized polysilicon mask (16). This produces relatively thick source and drain regions (18) and relatively thin gate regions (17). The relatively thick source and drain regions (18) educe the risk of dry contact etch problems. N-channel and P-channel threshold voltages are adjusted prior to the formation of active areas, thus substantially eliminating edge and back channel leakage. A sacrificial thin oxide layer (21) is employed in fabricating the N-well and P-well implants so that both front and back channel threshold voltage adjustments are controlled. Good control of doping profiles is obtained, leading to excellent threshold voltage control and low edge and back channel leakages. The speed of devices fabricated using the method of the present invention is high due to reduced capacitances resulting from thinner silicon-on-insulator films. The present invention is fabricated using present equipment and available technology, and provides an easy, straight forward and cost-effective process to fabricate very high speed CMOS devices which are latch-up free and radiation hardened.

6 Claims, 2 Drawing Sheets

HIGH SPEED SILICON-ON-INSULATOR DEVICE

This is a division of application Ser. No. 07/481,032, filed Feb. 16, 1990, U.S. Pat. No. 5,047,356.

BACKGROUND

This invention relates to semiconductor devices and fabrication processes and, more specifically, to a method of fabricating silicon-on-insulator semiconductor devices.

Complementary metal oxide semiconductor (CMOS) devices comprise a combination of P-channel and N-channel transistors. These devices operate at an intermediate speed for semiconductor devices and have an intermediate component density. CMOS devices are normally fabricated from a silicon wafer that, after processing, has an integrated circuit disposed on its surface.

A conventional method of silicon-on-insulator device fabrication includes depositing a layer of silicon on the top surface of an insulator wafer, then photomasking or delineating the surface of the wafer to define the active areas. This process allows areas of material to be selectively removed from the surface of the wafer. The next step involves diffusing in dopants, that will change the silicon layer into P-type or N-type, in unprotected areas of the silicon. After these dopants are diffused in, their concentrations are adjusted using implantation. The final step is a metallization process which involves placing a thin layer of metal over the surface of the wafer, for electrical connections, then etching away the undesired metal areas from the wafer.

In fabricating conventional silicon-on-insulator CMOS devices, it has heretofore been difficult to provide stable, low leakage, high performance devices that can be fabricated utilizing existing equipment and presently available technology. In attempting to fabricate very high-speed CMOS devices that are latch-up free and radiation hardened, the processes have not proved to be easy, straight-forward, and cost effective. The conventional processes for fabricating silicon-on-insulator CMOS devices involve delineating the active areas first and then adjusting the doping concentrations by implantation. However, the active area edge may not be perfectly vertical. It is difficult to control the impurity dopant concentrations on non-vertical active edges and at the corners. Poor control of doping profiles results in high leakage. Because of high leakages, it is very difficult to achieve a high yield of CMOS devices.

It is therefore an objective of the present invention to provide a silicon-on-insulator device that has low edge and back channel current leakages. Yet another objective of the invention is to provide a fabricating process that enables good control of doping profiles. A still further objective of the present invention is to fabricate a silicon-on-insulator device providing effective control of threshold voltages. Still another objective of the present invention is to fabricate a device that has thicker source and drain regions compared to the gate region. A further objective of the invention is to provide an easy, straight forward and cost-effective process to fabricate a controllable and reliable silicon-on-insulator CMOS device that is latch-up free and radiation hardened that can be achieved using present equipment and available technology.

SUMMARY OF THE INVENTION

In accordance with these and other objectives and advantages of the present invention, there is provided a high speed silicon-on-insulator (SOI) device structure and fabrication process. The process starts with a separation by implanted oxygen (SIMOX) wafer having a layer of 2400 Angstroms of silicon on a 3600 Angstrom layer of buried oxide. In the present invention, dopings are done prior to the formation of the active area. By using the method of fabrication of the present invention, the edges and corners of the active area are uniformly doped. Therefore, leakage is greatly reduced or eliminated. P-well and N-well masks are aligned to an oversized polysilicon mask, and have their implants formed and adjusted separately. Good control of doping profiles is obtained, leading to good threshold voltage control and low device leakage.

Improvement in speed and reduction in leakage of the silicon-on-insulator devices are achieved by the following. (1) Using a 2 micrometer oversized polysilicon mask to thin down the silicon-on-insulator film so that the resulting devices are fully depleted. Only the oversized polysilicon regions are thinner while the source and drain regions remain thicker to avoid a contact etch problem. An increase in mobilities and transconductances gives rise to 30% speed improvement. (2) Adjusting both P-channel and N-channel threshold voltages individually, by forming N-well and P-well implants before active area delineation. By using this procedure edge leakage and back channel leakage are eliminated. Both front and back channel devices are adjusted separately. (3) Using a sacrificial thin oxide in the N-well and P-well implants so that threshold voltage adjustments can be controlled.

A silicon-on-insulator integrated device having improved edge leakage characteristics in accordance with the present invention comprises an insulating semiconductor substrate having a silicon layer disposed on a buried oxide layer. The topmost silicon layer of the substrate is thinned to provide for fully depleted devices, and this provides for relatively thick source and drain regions adjacent the thinned portion. Implanted P-well locations are disposed on the substrate that have predetermined adjusted doping concentrations and profiles that minimize edge leakage thereof. Implanted N-well locations are also disposed on the substrate adjacent the P-well locations that have predetermined adjusted doping concentrations and profiles that minimize edge leakage thereof. Polysilicon gates are disposed on the thinned silicon layer. A glass layer is disposed over the substrate having vias disposed therein to provide for connection to the source and drain regions. Finally, electrically conductive material is disposed over the glass layer that provides electrical contacts, which glass layer typically comprises phosphoro-borosilicate glass.

A feature of the invention is that the speed of devices fabricated using this method is high due to reduced capacitances and reduced electric fields in the thinner silicon-on-insulator films. Increase in mobilities and transconductances give rise to a 30% speed improvement over conventional CMOS devices. By using the processing method of the present invention, good control of the doping profiles is obtained, leading to effective threshold voltage control and low current leakages. By doing N-well and P-well implants before the active area is delineated both front and back channel devices are adjusted separately for optimum threshold voltages, and edge leakage and back channel leakage are eliminated. The source and drain regions of the present invention remain thicker than in the prior art, thus reducing the risk of dry contact etch problems.

Another feature of the present invention is that since it is fabricated using present equipment and available technology, it provides an easy, straight forward and cost-effective process to fabricate very high speed CMOS devices which are latch-up free and radiation hardened. A stable, low leakage, and high performance device is achieved using the principles and advantages of the present invention.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1A:
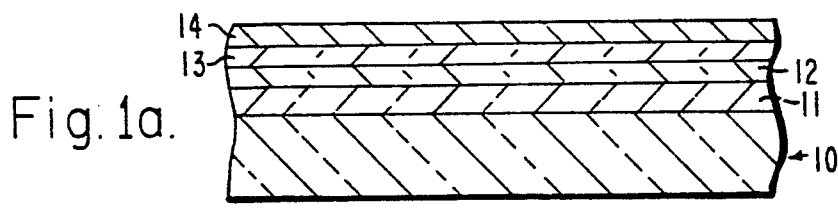
FIGS. 1a-1g illustrates a first sequence of steps for performing doping prior to formation of active areas in fabricating CMOS devices in accordance with the principles of the present.

Referring now to FIG. 1 of the drawings, there is provided an initial sequence of steps of an exemplary method of fabricating a silicon-on-insulator device in accordance with the present invention. With reference to FIG. 1a, the process starts with a SIMOX wafer 10, which comprises a separation-by-implanted-oxygen wafer, having a 2400 Angstrom layer of silicon 12 on a 3600 Angstrom buried oxide layer 11. The first step of the process is to form a layer of oxidation 13, approximately 500 Angstroms thick, on the surface of the silicon 12. A layer of nitride 14, approximately 1200 Angstroms thick, is deposited on the layer of oxide 13.

Figure 1B:
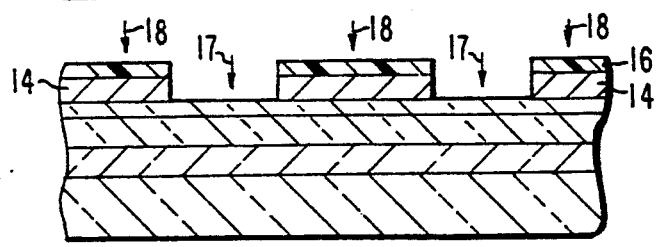

As shown in FIG. 1b, an oversized polysilicon mask 16 is formed over the layer of nitride 14, and the layer of nitride 14 is etched using the polysilicon mask 16. The etching step produces etched regions 17, while leaving source and drain regions 18. The polysilicon mask 16 is oversized by about two micrometers to thin down the silicon-on-insulator film (layer of silicon 12) so that subsequently formed devices are fully depleted. Only the etched regions 17 are thinner while the source and drain regions 18 remain thicker to avoid dry contact etch problems.

Figure 1C:
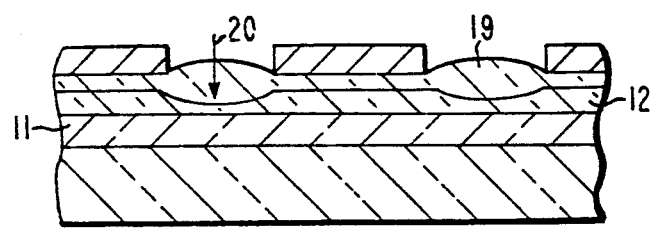
Figure 1D:
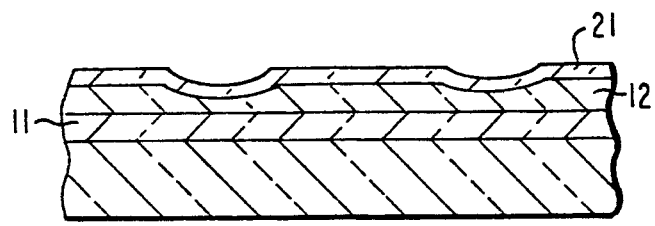

With reference to FIG. 1c, the layer of silicon 12 is oxidized to form a field oxidation layer 19. The field oxidation layer 19 has a generally concave shape 20 that thins the layer of silicon 12. The field oxidation layer 19 ranges in thickness from 2000 Angstroms to 3200 Angstroms, for example. The layer of nitride 14 and the field oxidation layer 19 are removed as indicated in FIG. 1d. A sacrificial thin oxide layer 21 is formed on the layer of silicon 12. The thin oxide layer 21 may be 300 Angstroms thick, for example, and is used to enhance implant profile control near the surface of the layer of silicon 12. By using the sacrificial oxide layer 21 threshold voltage adjustments are controlled.

Figure 1E:
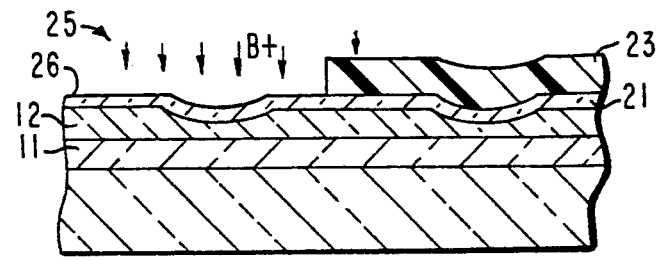
Figure 1F:
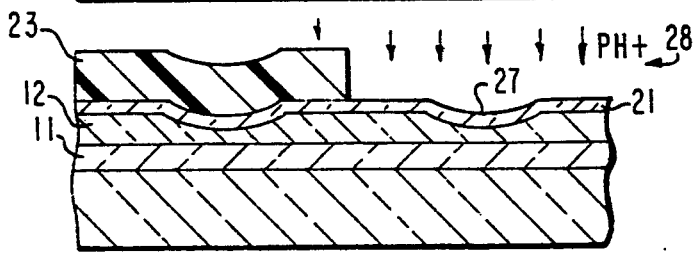
Figure 1G:
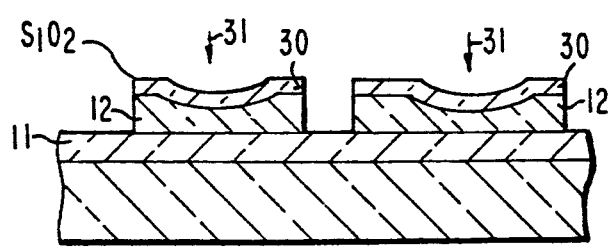

Referring to FIG. 1e, a mask 23, which may be made of a photoresist material, for example, is applied over a desired portion of the sacrificial thin oxide layer 21, and positively charged Boron (B+) ions 25, for example, are implanted in exposed regions of the thin oxide layer 21 to form P-well locations 26. With reference to FIG. 1f, the mask 23 is applied to different portions of the sacrificial oxide layer 21, and positively charged phosphorous (PH+) ions 28, for example, are implanted in an exposed region of the oxide layer 21 to form N-well locations 27. By forming implants in this phase of the fabrication process, P-channel and N-channel threshold voltages are adjusted individually, and front and back channel devices are adjusted separately. Edge and back channel leakages are eliminated using this process. This also adjusts the turn-on voltages of the devices that are to be formed. With reference to FIG. 1g, the sacrificial thin oxide layer (not shown) is stripped away and an active area mask 30, which may be made of photoresist, for example, is applied. The exposed areas of the surface of the layer of silicon 12 are etched away as defined by the active area mask 30 to form active areas 31.

Referring now to FIG. 2 of the drawings, there are illustrated further processing steps for fabricating devices in accordance with the present invention that complete CMOS device fabrication. As indicated in FIG. 2a, a gate oxide 33 is formed on the active areas 31, and then a layer of polysilicon 34 is deposited over the entire surface of the wafer 10. The layer of polysilicon 34 then has phosphorous (PH+) ions 28 diffused into it. Referring to FIG. 2b, a polysilicon mask 16 (not shown) is formed over the layer of polysilicon 34, and the layer of polysilicon 34 is etched. The remaining portions 37 of the layer of polysilicon 34 form gates of the devices.

Figure 2A:
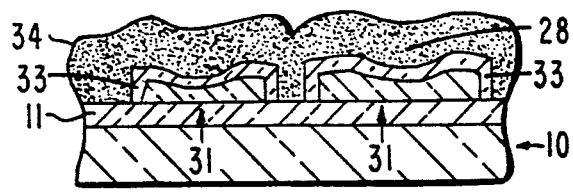
FIGS. 2a-2g illustrates further processing steps that complete the CMOS device fabrication process.
Figure 2B:
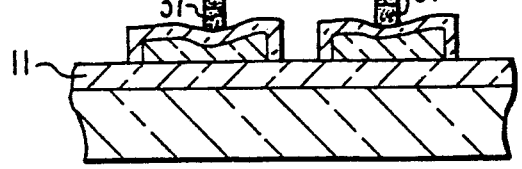
Figure 2C:
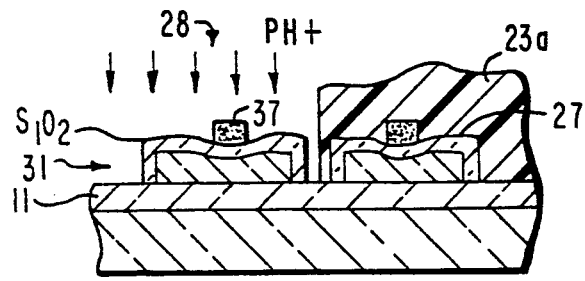
Figure 2D:
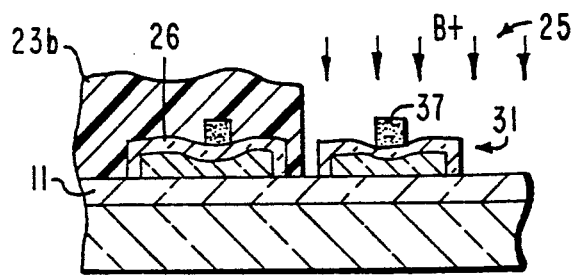
Figure 2E:
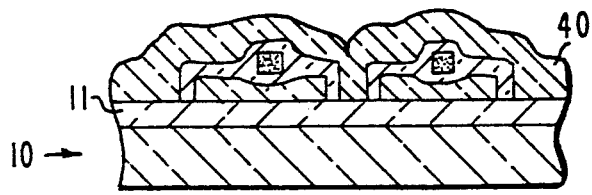
Figure 2F:
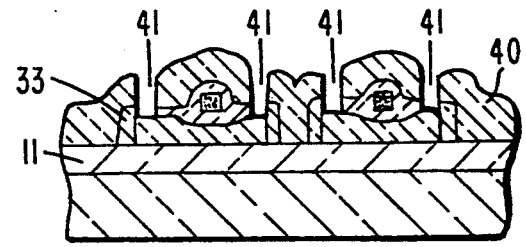

With reference to FIG. 2c, a first photoresist mask 23a is formed over the N-well locations 27 and phosphorous ions 28 are implanted in the exposed active areas 31. Referring to FIG. 2d, a second photoresist mask 23b is formed over the P-well locations 26 and boron ions 25 are implanted in the exposed active areas 31. Referring to FIG. 2e, a phosphoro-borosilicate glass layer 40 is disposed over the entire surface of the wafer 10. The phosphoro-borosilicate glass layer 40 is then reflowed at approximately 850° C. for about 20 minutes. With reference to FIG. 2f, the phosphoro-borosilicate glass layer 40 is then etched away to the gate oxide layer 33 to provide contact locations 41 for electrical connections (not shown) to the source and drain regions.

Figure 2G:
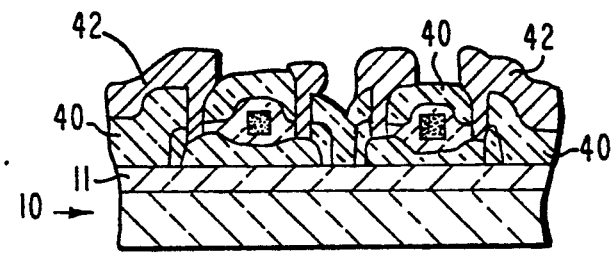

Referring to FIG. 2g, an electrically conductive material 42, which may be a metallic silicide material such as aluminum, tungsten or titanium tungsten, for example, is deposited on the phosphoro-borosilicate glass layer 40 and into the contact locations 41 to provide electrical connection between device formed on the wafer 10 and external devices (not shown). The electrically conductive material 42 is then etched to remove excess material from the phosphoro-borosilicate glass layer 40 to form the completed devices.

In view of the above discussion, the silicon-on-insulator integrated device having improved edge leakage characteristics in accordance with the present invention comprises an insulating semiconductor substrate 10 having a silicon layer 12 disposed on a buried oxide layer 11. The topmost silicon layer of the substrate 10 is thinned to provide for fully depleted devices, and this provides for relatively thick source and drain regions adjacent to the thinned portion. Implanted P-well locations are disposed on the substrate 10 that have predetermined adjusted doping concentrations and profiles that determine turn-on voltages of N-channel devices and minimize edge leakage thereof. Implanted N-well locations are also disposed on the substrate 10 adjacent the P-well locations that have predetermined adjusted doping concentrations and profiles that determine turn-on voltages of P-channel devices and minimize edge leakage thereof. Gate oxides 33 are grown on the thinned silicon layer and polysilicon gates 37 are disposed thereon. A glass layer 40 is disposed over the substrate 10 having contact locations 41, disposed therein to provide for connection to the source and drain regions. Finally, electrically conductive material 42 is disposed over the glass layer 40 that provides electrical contacts, which glass layer typically comprises phosphoro-borosilicate glass.

Thus there has been described a new and improved method of fabricating a silicon-on-insulator integrated circuit wafer and an integrated circuit device having improved edge and back-channel leakage characteristics. The increase in mobilities and transconductances, due to lower capacitances resulting from the thin silicon-on-insulator film, result in a high speed device that is 30% faster than conventional devices. By adjusting the doping profiles of the silicon-on-insulator film, the resulting device has the lowest possible leakage currents. P-channel and N-channel devices are adjusted individually for optimum turn-on voltages. By forming N-well and P-well implants prior to active area delineation, P-channel and N-channel threshold voltages are adjusted individually, and front and back channel devices are adjusted separately. Edge and back channel leakages are virtually eliminated using this process.

It is to be understood that the above-described exemplary method is merely illustrative of some of the many specific process steps which represent applications of the principles of the present invention. Clearly, numerous and other sequences of process steps can be readily devised by those skilled in the art without departing from the scope of the invention.

What is claimed is:

1. A silicon-on-insulator integrated device having improved edge leakage characteristics, said device comprising:

an insulating semiconductor substrate comprising a silicon layer disposed on a buried oxide layer, the silicon layer having a thinned central portion for placement of a gate and relatively thicker source and drain regions adjacent the thinned central portion the central portion providing for a fully depleted device;

implanted P-well locations formed on the substrate that have predetermined adjusted doping concentrations and profiles that minimize edge and back-channel leakages thereof;

implanted N-well locations formed on the substrate adjacent the P-well locations that have predetermined adjusted doping concentrations and profiles that minimize edge and back-channel leakages thereof;

wherein the silicon layer is located in one of the implanted P-well or N-well locations;

a polysilicon gate disposed over the thinned central portion of the silicon layer and separated from the silicon layer by an oxide layer;

a glass layer disposed over the substrate having vias disposed therein to provide for connection to the source and drain regions; and an electrically conductive layer disposed over the glass layer that provides electrical contacts.

2. The device of claim 1 wherein the substrate comprises a separation by implanted oxygen silicon wafer.

3. The device of claim 2 wherein the separation by implanted oxygen silicon wafer has a base layer of silicon and a layer of silicon implanted oxygen that is approximately 3600 Angstroms thick and a layer of silicon that is approximately 2400 Angstroms thick.

4. The device of claim 1 wherein the glass layer disposed over the substrate comprises phosphoro-borosilicate glass.

5. The device of claim 2 wherein the electrically conductive layer comprises a metallic silicide material.

6. The device of claim 5 wherein the metallic silicide material comprises aluminum, tungsten or titanium tungsten.

* * * * *